United States Patent [19]

Ikeda et al.

[11] Patent Number: 5,218,560
[45] Date of Patent: Jun. 8, 1993

[54] CIRCUIT FOR CONTROLLING TAP GAINS AT RAPID SPEED IN AN ADAPTIVE FILTER

[75] Inventors: Shigeji Ikeda; Akihiko Sugiyama, both of Tokyo, Japan

[73] Assignee: NEC Corporation, Tokyo, Japan

[21] Appl. No.: 670,100

[22] Filed: Mar. 15, 1991

[30] Foreign Application Priority Data

Mar. 15, 1990 [JP] Japan .................................. 2-66401

[51] Int. Cl.⁵ ............................................ G06F 15/31
[52] U.S. Cl. ................................................ 364/724.19
[58] Field of Search ...................... 364/724.01, 724.19, 364/724.20

[56] References Cited

U.S. PATENT DOCUMENTS 4,843,583  6/1989  White et al. ...................... 364/724.19

FOREIGN PATENT DOCUMENTS 0411741  2/1991  European Pat. Off. ........ 364/724.19

Primary Examiner—Long T. Nguyen
Attorney, Agent, or Firm—Sughrue, Mion, Zinn, Macpeak & Seas

[57] ABSTRACT

In a tap control circuit for use in an adaptive filter for filtering a received signal into a filtered signal in accordance with first through N-th controllable tap gains which are produced by a producing section dependent upon the filtered signal and a control parameter, where N represents a positive integer which is not less than one, a first generating section is for generating a first parameter and a second generating section, for generating a second parameter which is greater than the first parameter. A selecting section selects one of the first and the second generating sections to selectively supply the first and the second parameters as the control parameter to the producing section in accordance with the first through the N-th controllable tap gains. Preferably, the tap control circuit has a controlling unit for controlling the producing section to select selected ones of the first through the N-th controllable tap gains in accordance with the first through the N-th controllable tap gains. As soon as the adaptive filter is put into operation, the selecting section selects the first generating section to supply the first parameter to the producing section. When the selecting section selects the second generating section to supply the second parameter to the producing section, the controlling unit is put into operation and selects the selected ones of the first through the N-th controllable tap gains.

6 Claims, 3 Drawing Sheets

CIRCUIT FOR CONTROLLING TAP GAINS AT RAPID SPEED IN AN ADAPTIVE FILTER

BACKGROUND OF THE INVENTION

This invention relates to a tap control circuit for controlling controllable tap gains which is used in an adaptive filter.

An adaptive filter is supplied with a received signal through a transmission path to filter the received signal into a filtered signal in accordance with first through N-th controllable tap gains, where N represents a positive integer which is not less than one. The adaptive filter may be one of an echo canceller, a howling canceller, and an adaptive equalizer.

A conventional tap control circuit comprises a producing section for producing the first through the N-th controllable tap gains dependent upon the filtered signal and a control parameter which is representative of a varying rate of the first through the N-th controllable tap gains.

The received signal may be received through an input path at the adaptive filter. When taking a delaying time of the input path into consideration, it is necessary to make the positive number N very large in order to filter the received signal into a filtered signal as desired. Therefore, it is practically difficult to filter the received signal into the filtered signal because the conventional tap control circuit must control the first through the N-th controllable tap gains.

In order to practically filter the received signal into the filtered signal, an improved tap control circuit is disclosed in an article contributed by Shinichi Kawamura and Mitsutoshi Hatori to ICASSP of the IEEE (held 1986 in Tokyo), pages 2979 to 2982, under the title of "A TAP SELECTION ALGORITHM FOR ADAPTIVE FILTERS". The improved tap control circuit further comprises a controlling section for controlling the producing section to select selected ones of the first through the N-th controllable tap gains as first through K-th selected tap gains in accordance with the first through the N-th controllable tap gains, where K represents a positive integer which is less than the positive number N and is not less than one. This means that the adaptive filter filters the received signal into the filtered signal in accordance with the first through the K-th selected tap gains.

However, the control parameter is not varied in accordance with the first through the N-th controllable tap gains in the improved tap control circuit on selecting the first through the K-th selected tap gains from the first through the N-th controllable tap gains. This makes it difficult to rapidly select the first through the K-th selected tap gains from the first through the N-th controllable tap gains. Therefore, it is difficult to filter the received signal into the filtered signal in the adaptive filter at a rapid speed.

SUMMARY OF THE INVENTION

It is therefore an object of the invention to provide a tap control circuit capable of controlling controllable tap gains of an adaptive filter at a rapid speed so that the adaptive filter may filter a received signal into a filtered signal as desired.

Other objects of this invention will become clear as the description proceeds.

On describing the gist of this invention, it is possible to understand that a tap control circuit is for use in an adaptive filter for filtering a received signal into a filtered signal in accordance with first through N-th controllable tap gains, where N represents a positive integer which is not less than one. The tap control circuit comprises producing means for producing the first through the N-th controllable tap gains dependent upon the filtered signal and a control parameter and controlling means for controlling the producing means to select selected ones of the first through the N-th controllable tap gains in accordance with the first through the N-th controllable tap gains.

According to this invention, the above-understood tap control circuit further comprises first generating means for generating a first parameter, second generating means for generating a second parameter which is greater than the first parameter, and selecting means for selecting one of the first and the second generating means to selectively supply the first and the second parameters to the producing means in accordance with the first through the N-th controllable tap gains.

DESCRIPTION OF THE PREFERRED EMBODIMENT

Figure 1:
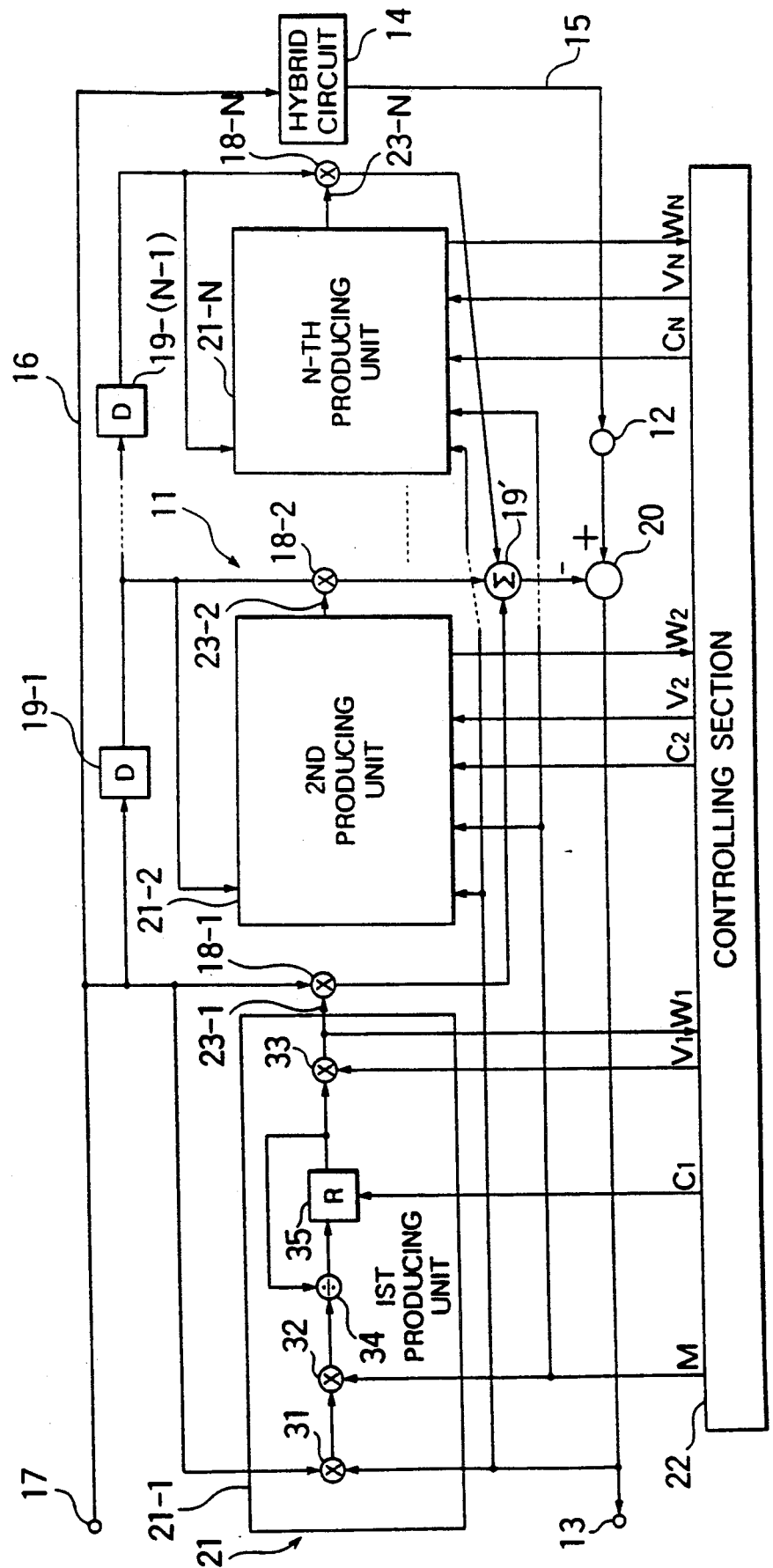
FIG. 1 is a block diagram of an echo canceller comprising a conventional tap control circuit.

Referring to FIG. 1, description will first be made as regards a conventional tap control circuit 10 for a better understanding of this invention. The tap control circuit 10 is for controlling first through N-th controllable tap gains W1 to WN which are used in an adaptive filter, where N represents a positive integer which is not less than one.

The adaptive filter may be one of an echo canceller, a howling canceller, and an adaptive equalizer. In the illustrated example, the adaptive filter is used as the echo canceller and will be designated by a reference numeral 11. The echo canceller 11 has input and output terminals 12 and 13. The input terminal 12 is connected to a hybrid circuit 14 through an input path 15. The hybrid circuit 14 is connected to a receiving path 16 which is connected to a receiving terminal 17. A transmitted signal is supplied to the receiving terminal 17 as a received signal through a transmission path (not shown). The transmitted signal may be, for example, a digital signal which is produced by sampling an analog signal at a sampling frequency f. The analog signal may be a speech signal. The received signal is received as an input signal at the input terminal 12 through the hybrid circuit 14.

The echo canceller 11 comprises first through N-th filter multipliers 18-1, 18-2, ..., and 18-N and first through (N−1)-th delay circuits (D) 19-1, ..., and 19-(N−1). Each of the first through the (N−1)-th delay circuits 19-1 to 19-(N−1) gives a delay of a predetermined time (1/f) to a signal supplied thereto. The received signal is supplied to the first filter multiplier 18-1. The first through the (N−1)-th delay circuits 19-1 to 19-(N−1) supply first through (N−1)-th delayed signals to the second through the N-th filter multipliers 18-2 to 18-N, respectively.

Supplied with the first controllable tap gain W1 in the manner which will presently be described, the first filter multiplier 18-1 multiplies the received signal by the first controllable tap gain W1 to supply a first multiplied signal to a filter adder 19'. The second through the N-th multipliers 18-2 to 18-N multiply the first through the (N−1)-th delayed signals by the second through the N-th controllable tap gains W2 to WN to supply second through N-th multiplied signals to the filter adder 19', respectively. The filter adder 19' calculates a total sum of the first through the N-th multiplied signals to supply the total sum as a filtered signal to a filter subtracter 20. Supplied with the input signal from the input terminal 12, the filter subtracter 20 subtracts the filtered signal from the input signal to deliver an error signal to the output terminal 13.

The tap control circuit 10 comprises a producing section 21 and a controlling section 22. The producing section 21 comprises first through N-th producing units 21-1, 21-2, ..., and 21-N for producing the first through the N-th controllable tap gains W1 to WN. The first through the N-th producing units 21-1 to 21-N are connected to the first through the N-th multipliers 18-1 to 18-N through first to N-th taps 23-1, 23-2, ..., and 23-N, respectively.

In the manner which will later be described, the controlling section 22 supplies the first through the N-th producing units 21-1, 21-2, ..., and 21-N with a control parameter M which is representative of a varying rate of the first through the N-th controllable tap gains W1 to WN. The control parameter may alternatively be called a step size. The controlling section 22 delivers first through N-th reset signals C1 to CN and first through N-th control signals V1 to VN to the first through the N-th producing units 21-1 to 21-N in accordance with the first through the N-th controllable tap gains W1 to WN in order to select selected ones of the first through the N-th controllable tap gains W1 to WN.

The first producing unit 21-1 comprises first through third unit multipliers 31 to 33, a producing unit adder 34, and a producing unit register (R) 35. In the illustrated example, each of the second through the N-th producing circuits 21-2 to 21-N comprises similar parts, which are depicted in the first producing circuit 21-1 alone.

The first unit multiplier 31 receives the received signal and the error signal and multiplies the received signal by the error signal to supply a first unit multiplied signal to the second unit multiplier 32. Supplied with the control parameter M, the second unit multiplier 32 multiplies the first unit multiplied signal by the control parameter M to supply second unit multiplied signal to the unit adder 34. The unit register 35 gives a delay of the predetermined time (1/f) to a signal supplied thereto. The unit register 35 supplies a producing unit delayed signal to the unit adder 34 and the third unit multiplier 33. The unit adder 34 adds the second unit multiplied signal to the unit delayed signal to supply a producing unit sum signal to the unit register 35. When supplied with first reset signal C1, the unit register 35 is reset as will be described hereinafter. The third unit multiplier 33 multiplies the unit delayed signal by the first control signal V1 to deliver a third unit multiplied signal as the first controllable tap gain W1 to the first filter multiplier 18-1 through the first tap 23-1. The second through the N-th producing units 21-2 to 21-N receive the first through the (N−1)-th delayed signals, respectively, and receive the error signal. The second through the N-th producing units 21-2 to 21-N produce the second through the N-th controllable tap gains W2 to WN in a similar manner as described in connection with the first producing unit 18-1.

Figure 2:
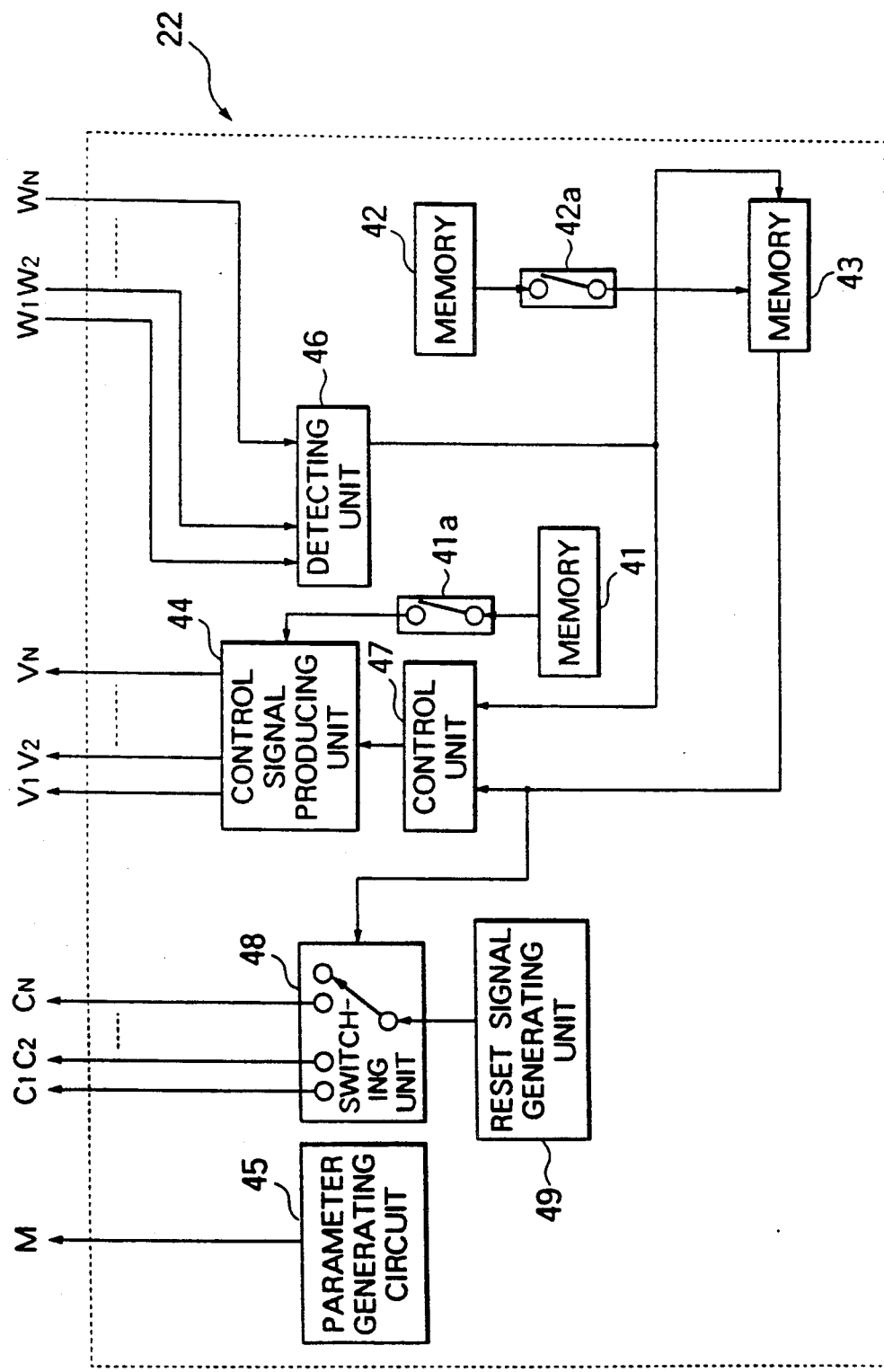
FIG. 2 is a block diagram of the conventional tap control circuit illustrated in FIG. 1.

Referring to FIG. 2, the controlling section 22 comprises first and second memories 41 and 42. The first memory 41 comprises a first tap number area (not shown) for memorizing first through N-th tap numbers and a first initial information area (not shown) for memorizing first through N-th initial information signals in one-to-one correspondence to the first through the N-th tap numbers. Each of the first through the N-th initial information signals may represent one of a logic zero and a logic one level. When each of the first through the N-th initial information signals represents the logic one level, the first through the N-th tap numbers will be called first through N-th effective tap numbers. When each of the first through the N-th initial information signals represents the logic zero level, the first through the N-th tap numbers will be called first through N-th invalid tap numbers. In the illustrated example, first through K-th predetermined ones of the first through the N-th tap numbers are memorized as first through K-th effective tap numbers in the first memory 41, where K represents a positive number which is less than N and is not less than one. Remaining ones of the first through the N-th tap numbers are memorized as first through P-th invalid tap numbers in the first memory 41, where P is a positive number which is equal to N"K. The second memory 42 is for memorizing the first through the P-th invalid tap numbers in an ascending order in a form of a queue.

On putting the echo canceller 11 (FIG. 1) into operation, first and second switches 41a and 42a are closed in a known manner. For example, the first and the second switches 41a and 42a might be automatically operated when a power source (not shown) is energized. The first through the P-th invalid tap numbers are read out of the second memory 42 to be supplied to a third memory 43 which is operable in a first-in-first-out fashion. The first through the N-th tap numbers and first through the N-th initial information signals are read out of the first memory 41 to be supplied to a control signal producing unit 44.

Referring to FIG. 2 together with FIG. 1, the control parameter M is supplied from a parameter generating circuit 45 to the first through the N-th producing units 22-1 to 22-N when the echo canceller 11 is put into operation.

Responsive to the first through the N-th tap numbers and first through the N-th initial information signals, the control signal producing unit 44 produces the first through the N-th control signals V1 to VN, which represent one of the logic zero and the logic one levels in conjunction with the first through the N-th initial information signals. For example, the first control signal V1 represents the logic zero level when the first initial information signal has the logic zero level. As described above, the third unit multiplier 33 multiplies the unit delayed signal by the first control signal V1. When the first control signal V1 represents the logic zero level, the third unit multiplier 33 produces the first controllable tap gain W1 of a zero level.

The first through the N-th controllable tap gains W1 to WN are delivered to a minimum detecting unit 46. The detecting unit 46 periodically detects whether or not one of the first through the N-th first through the N-th controllable tap gains W1 to WN is coincident with a prescribed value which may be a positive value equal to a smallest one among absolute values of the first through the N-th controllable tap gains W1 to WN. The detecting unit 46 produces a k-th tap signal representative of a k-th effective tap number when the k-th controllable tap gain Wk is coincident with the prescribed value, where k is a positive number selected between 1 and K. The k-th tap signal is supplied from the detecting unit 46 to the third memory 43 and a control unit 47.

When the k-th tap signal is supplied to the third memory 43, the first invalid tap number is read out of the third memory 43 as an effective tap number and is supplied as the effective tap number to the control unit 47 and a switching unit 48. The third memory 43 memorizes the k-th tap number as a k-th invalid tap number behind the P-th invalid tap number in the first-in-first-out fashion. Supplied with the k-th tap signal and the effective tap number, the control unit 47 controls the control signal producing unit 44 so that the control signal producing unit 44 makes a k-th control signal Vk have the logic zero level in correspondence to the k-th tap number and makes a p-th control signal Vp have the logic one level in correspondence with the effective tap number, where p is a positive number between 1 and P. The switching unit 48 is responsive to the effective tap number and connects a reset signal generating unit 49 to a p-th producing unit 21-p corresponding to the effective tap number to supply a p-th reset signal to the p-th producing unit.

As described above, the controlling section 22 produces the first through the N-th control signals V1 to VN and controls the producing section 21 to select the selected ones of the first through the N-th controllable tap gains W1 to WN as first through K-th selected tap gains so that the echo canceller 11 filters the received signal into the filtered signal as desired.

However, the illustrated tap control circuit does not vary the control parameter M in accordance with the first through the N-th controllable tap gains W1 to WN on selecting the first through the K-th selected tap gains from the first through the N-th controllable tap gains W1 to WN. Therefore, it is difficult to rapidly select the first through the K-th selected tap gains from the first through the N-th controllable tap gains W1 to WN.

Figure 3:
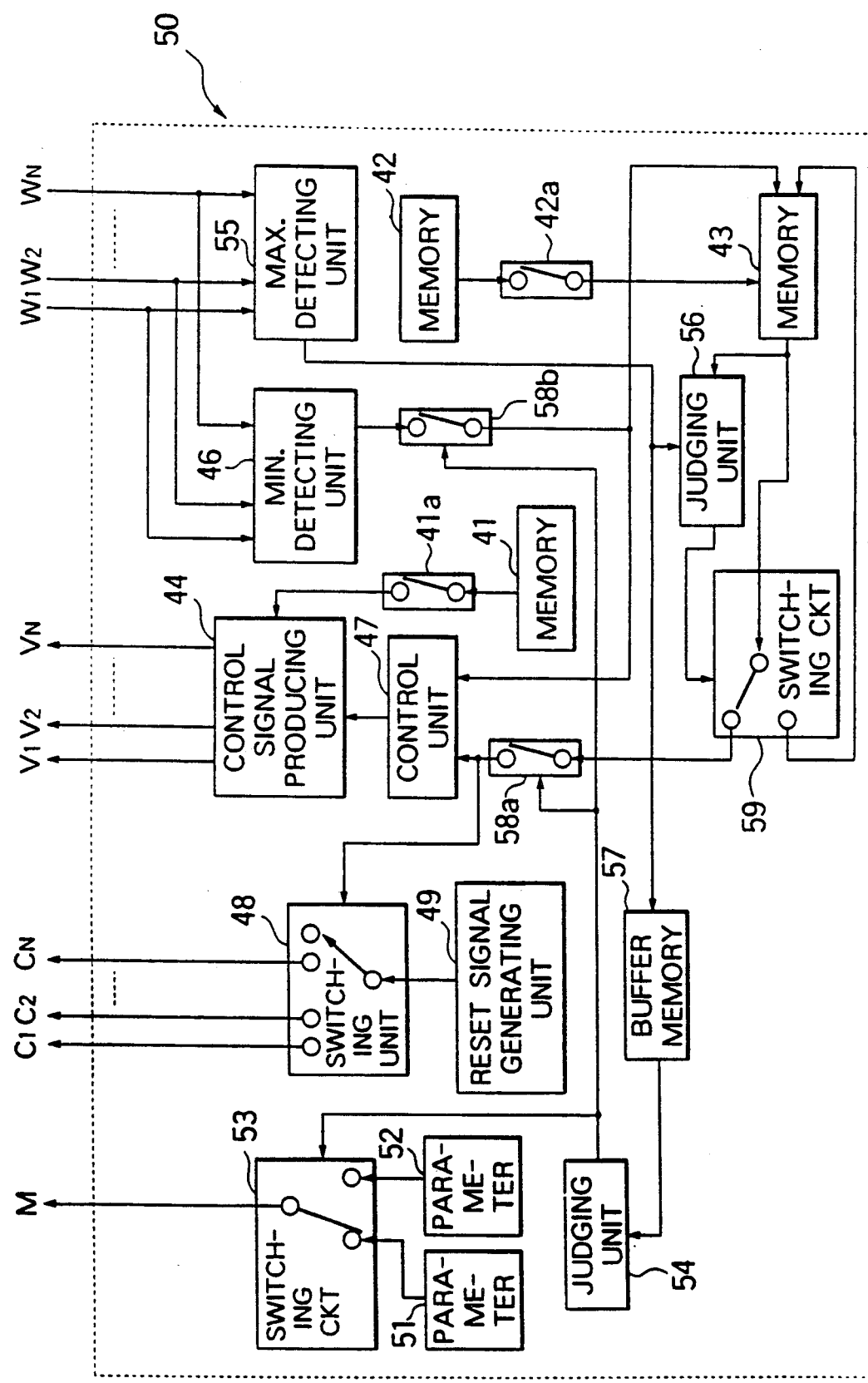
FIG. 3 is a block diagram of a tap control circuit according to an embodiment of this invention.

Referring to FIG. 3, the description will proceed to a tap control circuit according to a preferred embodiment of this invention. The illustrated tap control circuit is different from the tap control circuit 10 illustrated with reference to FIG. 2 and is therefore designated afresh by a reference numeral 50. The tap control circuit 50 comprises similar parts which are designated by like reference numerals and are operable with likewise named and denoted signals. It should be noted that the tap control circuit 50 controls the echo canceller 11 described in connection with FIG. 1 instead of the tap control circuit 10.

The tap control circuit 50 further comprises first and second parameter generating units 51 and 52. The first parameter generating unit 51 generates a first parameter $\mu 1$. The second parameter generating unit 52 generates a second parameter $\mu 2$ which is greater than the first parameter $\mu 1$. The first parameter $\mu 1$ may be equal to $2^{-7}$. The second parameter $\mu 2$ may be equal to $2^{-1}$. When the echo canceller 11 (FIG. 1) is put into operation, the first parameter is supplied as the control parameter M to the first through the N-th producing units 21-1 to 21-N (FIG. 1) through a first switching circuit 53 which is controlled by a first judging unit 54 as will be described hereinafter.

As described above, the first through the second switches 41a and 42a are closed when the echo canceller 11 (FIG. 1) is put into operation. The first through the N-th tap numbers and the first through the N-th initial information signals are supplied from the first memory 41 to the control signal producing unit 44. The first through the P-th invalid tap numbers are delivered from the second memory 42 to the third memory 43. The control signal producing unit 44 produces the first through the N-th control signals V1 to VN in accordance with the first through the N-th tap numbers and the first through the N-th initial information signals to supply the first through the N-th control signals V1 to VN to the first through the N-th producing units 21-1 to 21-N (FIG. 1).

The controllable tap gains W1 to WN are supplied from the first through the N-th producing units 21-1 to 21-N (FIG. 1) to a maximum detecting unit 55. The maximum detecting unit 55 periodically detects whether or not one of the first through the N-th controllable tap gains W1 to WN is coincident with a predetermined value. The predetermined value may be a largest one among absolute values of the first through the N-th controllable tap gains W1 to WN. When one of the first through the N-th controllable tap gains W1 to WN is coincident with the predetermined value, the maximum detecting unit 55 produces a maximum tap signal representative of a n-th tap number, where n is one of the positive integer N. The maximum detecting unit 55 supplies the maximum tap signal to a second judging unit 56 and a buffer memory 57.

The maximum tap signal is memorized in the buffer memory 57 as a buffered tap number. This is because the maximum tap signal is periodically supplied from the maximum detecting unit 55 to the buffer memory 57. The buffer memory 57 memorizes a plurality of buffered tap numbers which may be different from each other. The buffer memory 57 memorizes the buffered tap numbers which are equal in number to a predetermined number. When the buffer memory 57 memorizes the buffered tap numbers of the predetermined number, the buffer memory 57 outputs the buffered tap numbers to the first judging unit 54. The predetermined number is, for example, 80.

The first judging unit 54 first counts specific tap numbers which are equal to each other among the buffered tap numbers. The first judging unit 54 produces a count signal which is representative of the number of the specific tap numbers. Namely, the count signal has a variable level depending on the number of the specific tap numbers. The first judging unit 54 judges whether or not the level of the count signal is not less than a predetermined threshold level or number which is not greater than the predetermined number. For example, the predetermined threshold level is specified by a count of seventy-two. When the level of the count signal is not less than the threshold level, the first judging unit 54 produces a driving signal to select the second parameter generating unit 52. For example, the first judging unit 54 produces the driving signal when the number of the specific tap numbers is not less than the predetermined threshold level.

Supplied with the driving signal, the first switching circuit 53 connects the second parameter generating unit 52 to the first through the N-th producing units 21-1 to 21-N to supply the second parameter $\mu 2$ as the control parameter M to the first through the N-th producing units 21-1 to 21-N. The driving signal is supplied further to third and fourth switches 58a and 58b to close the third and the fourth switches 58a and 58b. When the fourth switch 58b is closed, the minimum detecting unit 46 supplies the k-th tap signal to the third memory 43.

Supplied with the k-th tap signal, the third memory memorizes the k-th tap number behind the P-th invalid tap number in the first-in-first-out fashion and outputs the first invalid tap number to supply the first invalid tap number to the second judging unit 56. As described above, the second judging unit 56 is supplied with the maximum tap signal. When the relationship among the first invalid tap number, the n-th tap number, and the positive number K satisfies an inequality (1), the second judging unit 56 produces a switching signal to supply the switching signal to a second switching circuit 59.

$$n - K \leq S1 \leq n + K, \qquad (1)$$

where S1 represents the first invalid tap number.

Supplied with the switching signal, the second switching circuit 59 connects the third memory 43 to the control unit 47 through the third switch 58a to supply the first invalid tap number as the effective tap number to the control unit 47.

On the other hand, the second switching circuit 59 supplies the first invalid tap number to the third memory 43 when the switching signal is not supplied to the second switching circuit 59. The third memory memorizes the first invalid tap number behind the k-th invalid tap number in the first-in-first-out fashion and outputs the second invalid tap number to supply the second invalid tap number to the second judging unit 56. The second judging unit 56 judges the relationship among the second invalid tap number, the n-th tap number, and the positive integer N in a similar manner described in connection with the inequality (1).

The k-th tap number signal and the effective tap number signal are supplied to control unit 47 after the third and fourth switches 58a and 58b are closed, respectively, namely, after the second parameter $\mu 2$ is supplied as the control parameter M to the first through the N-th producing units 21-1 to 21-N.

Supplied with the k-th tap number signal and the effective tap number, the control unit 47 controls the control signal producing unit 44 in a manner similar to that described in conjunction with FIG. 2. As a result, the control signal producing unit 44 makes the k-th control signal Vk have the logic zero level in correspondence to the k-th tap number and makes the p-th control signal Vp have the logic one level in correspondence to the effective tap number.

In addition, the effective tap number signal is supplied to the switching unit 48 through the third switch 58a. Supplied with the effective tap number signal, the switching unit 48 delivers the p-th reset signal from the reset signal generating unit 49 to the p-th producing unit 21-p as described in connection with FIG. 2.

Reviewing FIG. 3, it is now understood that the first judging unit 54, the second detecting circuit 55, and the buffer memory 57 are operable collectively as a selecting section for selecting one of the first and the second parameter generating circuits 51 and 52 to selectively supply the first and the second parameter $\mu 1$ and $\mu 2$ as the control parameter M in accordance with the first through the N-th controllable tap gains W1 to WN.

What is claimed is:

1. A tap control circuit for use in an adaptive filter for filtering a received signal into a filtered signal in accordance with first through N-th controllable tap gains, where N represents a positive integer which is not less than one, said tap control circuit comprising:
    first through N-th producing means for producing said first through said N-th controllable tap gains dependent upon said filtered signal and a control parameter;
    first generating means for generating a first parameter;
    second generating means for generating a second parameter which is greater than said first parameter; and
    selecting means for selecting one of said first and said second generating means to selectively supply said first and said second parameters as said control parameter to said first through said N-th producing means in accordance with said first through said N-th controllable tap gains.

2. A tap control circuit as claimed in claim 1, wherein said selecting means selects said first generating means to supply said first parameter to said first through said N-th producing means when said adaptive filter is put into operation.

3. A tap control circuit as claimed in claim 2, wherein said selecting means comprises:
    first detecting means for periodically detecting whether or not one of said first through said N-th controllable tap gains is coincident with a predetermined value, said first detecting means producing a first tap signal when one of said first through said N-th controllable tap gains is coincident with said predetermined value;
    counting means for counting said first tap signal to produce a count signal having a variable level; and
    judging means for judging whether or not the level of said count signal is greater than a predetermined threshold level, said judging means producing a driving signal to select said second generating means when the level of said count signal is greater than said predetermined threshold level.

4. A tap control circuit as claimed in claim 3, wherein said predetermined value is a largest one among absolute values of said first through said N-th controllable tap gains.

5. A tap control circuit as claimed in claim 3, said first through said N-th producing means supplying said first through said N-th controllable tap gains to said adaptive filter through first through N-th taps, respectively, said first tap signal being representative of a first one of said first through said N-th taps, wherein:
    said tap control circuit further comprises:
    controlling means for controlling each of said first through said N-th producing means to select selected ones of said first through said N-th controllable tap gains from said first through said N-th controllable tap gains;
    said controlling means comprising:
    second detecting means responsive to said driving signal for periodically detecting whether or not one of said first through said N-th controllable tap gains is coincident with a prescribed value, said second detecting means producing a second tap signal when the last-mentioned one of said first through said N-th controllable tap gains is coincident with said prescribed value, said second tap signal being representative of a second one of said first through said N-th taps;

third generating means for generating a third one of said first through said N-th taps as a third tap signal;

path means for letting said third tap signal pass as a fourth tap signal depending on said second tap signal and said third tap signal; and determining means for determining the selected ones of said first through said N-th controllable tap gains as first through K-th selected tap gains in accordance with said second and said fourth tap signals, where K represents a positive number which is less than said positive integer N and is not less than one.

6. A tap control circuit as claimed in claim 5, wherein said prescribed value is a positive value which is equal to a smallest one among absolute values of said first through said N-th controllable tap gains.

* * * * *